United States Patent
Oh et al.

(10) Patent No.: US 9,175,886 B2
(45) Date of Patent: Nov. 3, 2015

(54) HEAT EXCHANGER HAVING THERMOELECTRIC ELEMENT

(71) Applicant: Hyundai Motor Company, Seoul (KR)

(72) Inventors: Man Ju Oh, Gyeonggi-do (KR); Jae Woong Kim, Gyeonggi-do (KR); Jae Woo Park, Gyeonggi-do (KR); Jae Hoon Kim, Chungcheongnam-do (KR)

(73) Assignees: Hyundai Motor Company, Seoul (KR); Kbautotech Co., Ltd.

( * ) Notice: Subject to any disclaimer, the term of this patent is extended or adjusted under 35 U.S.C. 154(b) by 271 days.

(21) Appl. No.: 13/839,546

(22) Filed: Mar. 15, 2013

(65) Prior Publication Data
US 2014/0174099 A1    Jun. 26, 2014

(51) Int. Cl.
| F25B 21/02 | (2006.01) |
| F28D 9/00 | (2006.01) |
| H01L 35/02 | (2006.01) |
| B60H 1/00 | (2006.01) |

(52) U.S. Cl.
CPC . F25B 21/02 (2013.01); F28D 9/00 (2013.01); H01L 35/02 (2013.01); B60H 1/00478 (2013.01)

(58) Field of Classification Search
CPC ........... F25B 21/02; F28D 9/00; H01L 35/02; H01L 25/00; H01L 25/02; H01L 25/04; H01L 35/00; H01L 37/00; B60H 1/00478
USPC ..................................................... 62/3.2, 3.7
See application file for complete search history.

(56) References Cited

U.S. PATENT DOCUMENTS

| 4,829,771 | A | * | 5/1989 | Koslow et al. ................. 62/3.64 |
| 5,226,298 | A | * | 7/1993 | Yamamoto et al. .............. 62/3.4 |
| 5,385,020 | A | * | 1/1995 | Gwilliam et al. ................ 62/3.7 |
| 6,970,399 | B2 | * | 11/2005 | Watanabe et al. ............. 368/204 |
| 8,307,839 | B2 | * | 11/2012 | Peukert et al. ................. 134/107 |
| 2006/0157102 | A1 | * | 7/2006 | Nakajima et al. ............. 136/205 |
| 2007/0056646 | A1 | * | 3/2007 | Dourdeville .................. 137/828 |
| 2008/0083447 | A1 | * | 4/2008 | Sienel ........................... 136/224 |
| 2010/0031988 | A1 | * | 2/2010 | Bell .............................. 136/200 |
| 2010/0037626 | A1 | * | 2/2010 | Liebmann et al. .............. 62/3.3 |
| 2010/0058778 | A1 | * | 3/2010 | Bhatti et al. .................... 62/3.7 |
| 2011/0120146 | A1 | * | 5/2011 | Ota et al. ........................ 62/3.3 |
| 2012/0023970 | A1 | * | 2/2012 | Lee et al. ........................ 62/3.2 |

FOREIGN PATENT DOCUMENTS

| JP | 2000-258084 A | 9/2000 |
| JP | 2001-174096 A | 6/2001 |

(Continued)

*Primary Examiner* — Mohammad M Ali
(74) *Attorney, Agent, or Firm* — Mintz Levin Cohn Ferris Glovsky and Popeo, P.C.; Peter F. Corless

(57) ABSTRACT

A heat exchanger having a thermoelectric element. A heat-generating pack defines therein a circulation space, and has a passage in an upper portion of one end and a passage in the lower portion of the opposite end. A heat-absorbing pack defines therein a circulation space, and has a passage in the lower portion of one end and a passage in the upper portion of the opposite end. The heat-generating pack and the heat-absorbing pack are stacked on each other. The thermoelectric element is disposed between the heat-generating pack and the heat-absorbing pack, and has a heat-generating surface adjoining the heat-generating pack and a heat-absorbing surface adjoining the heat-absorbing pack.

10 Claims, 3 Drawing Sheets

(56) References Cited

FOREIGN PATENT DOCUMENTS

| | | |
|---|---|---|
| JP | 2007-212084 A | 8/2007 |
| JP | 2012-096695 A | 5/2012 |
| KR | 20-0232600 | 5/2001 |
| KR | 10-2011-0073101 A | 6/2011 |
| KR | 10-2012-0005710 A | 1/2012 |
| KR | 10-2012-0026835 | 3/2012 |

* cited by examiner

HEAT EXCHANGER HAVING THERMOELECTRIC ELEMENT

CROSS-REFERENCE TO RELATED APPLICATION

This application claims under 35 U.S.C. §119(a) the benefit of Korean Patent Application No. 10-2012-0152950 filed Dec. 26, 2012, the entire contents of which are incorporated herein by reference.

BACKGROUND

1. Field of the Invention

The present invention relates to a heat exchanger having a thermoelectric element which can transfer heat from one fluid to another fluid using the thermoelectric element.

2. Description of the Related Art

A cooling system of an electric vehicle or a hybrid vehicle typically uses a refrigerant cycle in which cold air is produced by circulating a refrigerant. Therefore, this system requires a number of components, such as an electric compressor, a capacitor, an evaporator and refrigerant lines, and spaces for these components, leading to an excessive weight and costs.

When there is no cooling water or temperature is low according to characteristics of a vehicle, a heating apparatus requires a positive temperature coefficient (TPC) heater for heating. Therefore, in this situation, development of a system that does not use a refrigerant that is subjected to Freon gas regulation, has a reduced weight, is made up of simple components, and can realize both cooling and heating is required.

As an alternative, a system for transferring heat between flows of cooling water using a Peltier element is required that carries out indoor cooling/heating. This system concurrently carries out cooling/heating using the Peltier element, and feeds cooling water to an indoor heat exchanger core by heating or cooling the cooling water using a characteristic of a heat pump.

For example, a related heat exchanger may include a plurality of shell tubes, a header and a plurality of plate tubes. The shell tubes have the shape of a flat tube, have defined therein first accommodation spaces which receive first fluid, and are arranged such that they are spaced apart from each other in the up-down direction of the heat exchanger. The header includes a first header section and a second header section which are disposed on both ends of the shell tubes in the longitudinal direction of the shell tubes. The both ends of the shell tubes are coupled to the first header section and second header so as to communicate with each other. The header has an inlet through which the first fluid is supplied from the outside and an outlet through which the first fluid is discharged. The plate tubes are respectively positioned between the shell tubes such that the upper and lower surfaces of the plate tubes adjoin the lower and upper surfaces of the shell tubes. The plate tubes have defined therein second accommodation spaces which receive the second fluid, and have an inlet through which the second fluid is introduced and an outlet through which the second fluid is discharged. This heat exchanger is generally compact and occupies a small space, thereby enhancing the utilization of the space. This heat exchanger is also configured such that the shell tubes and the plate tubes having the same shape are stacked on one other, and thus can obtain an excellent heat transfer effect even from a small size. In addition, since it is possible to vary the number of the tubes which are stacked on one another, the heat exchanger can be easily modified depending on the design requirements.

However, this structure does not use a thermoelectric element, and thus must be changed when the thermoelectric element is applied thereto. Specifically, when the thermoelectric element is disposed in this heat exchanger, it is required to ensure that heat is efficiently transferred while effectively realizing a compact size. In addition, it is required to rapidly remove or add an opposing row in order to enhance the efficiency of the thermoelectric element. However, this heat exchanger does not sufficiently exhibit these characteristics.

The information disclosed in the Background of the Invention section is only for the enhancement of understanding of the background of the invention, and should not be taken as an acknowledgment or any form of suggestion that this information forms a prior art that would already be known to a person skilled in the alt.

SUMMARY

Accordingly, the present invention has been made keeping in mind the above problems occurring in the related art, and the present invention is intended to provide a heat exchanger having a thermoelectric element which is reduced in size in order to maximize the efficiency of the thermoelectric element which is contained in the heat exchanger having a laminated structure.

In order to achieve the above object, according to one aspect of the present invention, there is provided a heat exchanger that includes a heat-generating pack defining therein a circulation space, the heat-generating pack having a passage in the upper portion of one end of the heat generating pack and a passage in the lower portion of an opposite end of the heat generating pack. Also included is a heat-absorbing pack defining therein a circulation space, the heat-absorbing pack having a passage in the lower portion of one end of the heat-absorbing pack and a passage in the upper portion of the opposite end of the heat-absorbing pack, the heat-generating pack and the heat-absorbing pack being stacked on each other. Furthermore, a thermoelectric element is disposed between the heat-generating pack and the heat-absorbing pack. The thermoelectric element has a heat-generating surface adjoining the heat-generating pack and a heat-absorbing surface adjoining the heat-absorbing pack.

Each of the heat-generating pack and the heat-absorbing pack may have plate-shaped upper and lower surfaces, peripheries of the upper and lower surfaces adjoining and being coupled with each other. The heat-generating pack and the heat-absorbing pack may be stacked on each other such that the passages in one end and the opposite end of the heat-generating packs and the passages in one end and the opposite end of the heat-absorbing packs do not overlap each other.

The heat exchanger may include a plurality of the heat-generating packs and a plurality of the heat-absorbing packs which alternate with each other and are stacked on top of one another and a plurality of the thermoelectric elements which are respectively interposed between the heat-generating packs and the heat-absorbing packs. The heat-generating packs and the heat-absorbing packs may be stacked on one another such that the passages in one end of each of the heat-generating packs are connected to each other and the passages in the opposite end of each of the heat-generating packs are connected to each other.

The heat-generating packs may respectively have protruding tubes on the front and rear portions of the passages. The protrusions on the passages in one end of each of the heat-generating packs may be connected to each other, and the protrusions on the passages in the opposite end of each of the heat-generating packs may be connected to each other. The thickness of each portion where opposing protruding tubes from among the protruding tubes are connected may be equal to the thickness of each of the thermoelectric elements, such that the thermoelectric elements are in close contact between the heat-generating packs and the heat-absorbing packs.

The heat-generating packs and the heat-absorbing packs may be stacked on one another such that the passages in one end of each of the heat-absorbing packs are connected to each other and the passages in the opposite end of each of the heat-absorbing packs are connected to each other. The heat-absorbing packs may likewise respectively have protruding tubes on the front and rear portions of the passages, the protrusions on the passages in one end of each of the heat-absorbing packs being connected to each other, and the protrusions on the passages in the opposite end of each of the heat-absorbing packs being connected to each other. The thickness of each portion where opposing protruding tubes from among the protruding tubes are connected may be equal to the thickness of each of the thermoelectric elements, such that the thermoelectric elements are in close contact between the heat-generating packs and the heat-absorbing packs.

The heat exchanger may further include a heat conduction fin structure inside the circulation space of the heat-generating pack or the heat-absorbing pack. The heat conduction fin structure may extend from one end to the opposite end of the heat in any direction. Both ends of the heat conduction fin structure may be in close contact with inner surfaces of the heat-generating pack or the heat-absorbing pack.

According to the above-described structure of the heat exchanger, it is possible to have a reduced size in order to maximize the efficiency of the thermoelectric elements which is contained in the heat exchanger having a laminated structure. In addition, since the plurality of passages are formed, it is possible to carry out heating/cooling not only in a target side but also in the side opposite the thermoelectric elements. It is therefore possible to utilize the maximum efficiency of the thermoelectric elements using, for example, waste heat or dissipation heat of a vehicle.

BRIEF DESCRIPTION OF THE DRAWINGS

The above and other objects, features and advantages of the present invention will be more clearly understood from the following detailed description when taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Reference will now be made in greater detail to a heat exchange having a thermoelectric element according to the present invention, exemplary embodiments of which are illustrated in the accompanying drawings.

Figure 1:
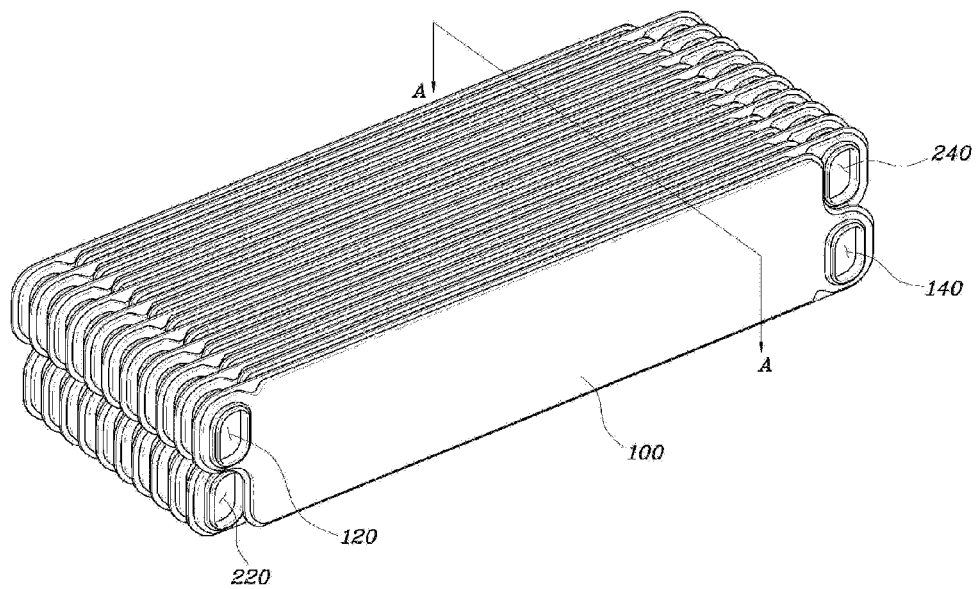
FIG. 1 is a perspective view showing a heat exchange having a thermoelectric element according to an exemplary embodiment of the present invention.
Figure 2:
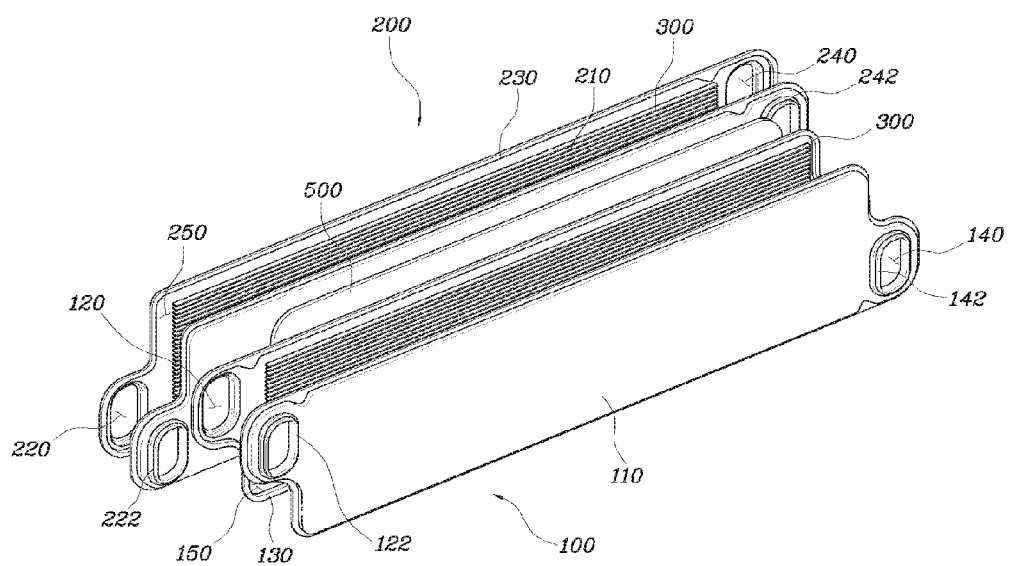
FIG. 2 is an exploded perspective view of the heat exchange having a thermoelectric element shown in FIG. 1.
Figure 3:
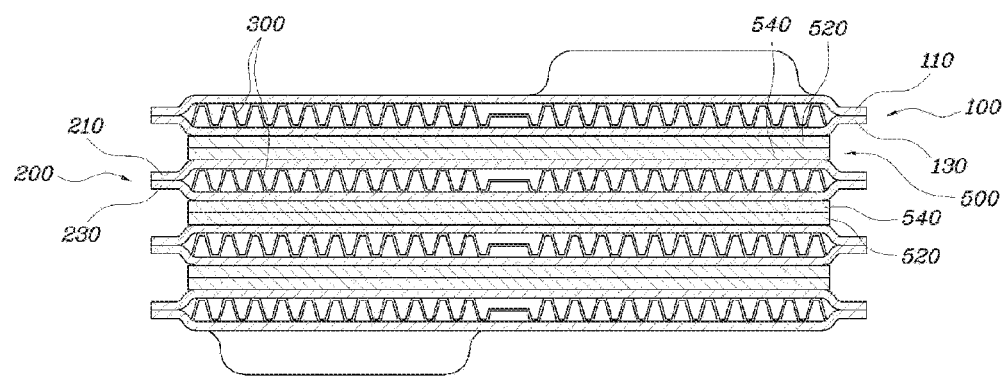
FIG. 3 is a cross-sectional view of the heat exchanger taken along line A-A in FIG. 1.

FIG. 1 is a perspective view showing a heat exchange having a thermoelectric element according to an embodiment of the present invention, FIG. 2 is an exploded perspective view of the heat exchange having a thermoelectric element shown in FIG. 1, and FIG. 3 is a cross-sectional view of the heat exchanger taken along line A-A in FIG. 1.

The heat exchanger having a thermoelectric element according to this exemplary embodiment includes heat-generating packs 100, heat-absorbing packs 200 and thermoelectric elements 500. Each of the heat-generating packs 100 has defined therein a circulation space 150, and has passages 120 and 140 in an upper portion of one end and an lower portion of the opposite end of the heat-generating pack. Each of the heat-absorbing packs 200 has defined therein a circulation space 250, and has passages 220 and 240 in a lower portion of one end and an upper portion of the opposite end of the heat-absorbing pack. The heat-generating packs 100 and the heat-absorbing packs 200 are stacked on one another. Each of the thermoelectric elements 500 is disposed between one heat-generating pack 100 and one heat-absorbing pack 200, with a heat-generating surface 520 thereof adjoining the heat-generating pack 100, and a heat-absorbing surface 540 thereof adjoining the heat-absorbing pack 200.

First, each of the heat-generating packs 100 and the heat-absorbing packs 200 is formed by abutting and coupling the peripheries of the upper surface 110 or 210 and the lower surface 130 or 230 to each other. That is, the upper surface and the lower surface each having the shape of a plate are coupled to each other at the peripheries, thereby forming the heat-generating pack and the heat-absorbing pack. The main areas of the upper surface and the lower surface are spaced apart from each other a predetermined distance, thereby forming the circulation space therein.

In addition, the heat-generating pack 100 has the passages 120 and 140 in the upper portion of one end and the lower portion of the opposite end, in which the passages communicate with the circulation space 150 inside the pack, such that fluid enters through one of the passages, flows through the circulation space, and then exits through the other one of the passages. Likewise, each of the heat-absorbing packs 200 has the passages 220 and 240 in the upper portion of one end and the lower portion of the opposite end.

In particular, the passages of the heat-generating packs 100 are formed at the same positions so that they do not overlap the passages of the heat-absorbing packs 200. Specifically, the passage 120 of the heat-generating pack 100 are formed in the upper portion of one end, and the passage 220 of the heat-absorbing pack 200 is formed in the lower portion of one end, such that the passage 120 does not overlap the passage 220. In this fashion, a fluid that is introduced into and discharged from the heat-generating packs 100 and a fluid that is introduced into and discharged from the heat-absorbing packs 200 are isolated from each other, such that a heat-generating function and a heat-absorbing function can be carried out independently.

The heat-generating packs 100 and the heat-absorbing packs 200 are stacked such that the passages 120 and 220 in one end and the passages 140 and 240 in the opposite end do not overlap each other. The plurality of heat-generating packs 100 and the plurality of heat-absorbing packs 200 alternate with each other, and the thermoelectric elements 500 are respectively interposed between the individual packs.

Each of the thermoelectric elements 500 for the most part has a heat-generating surface 520 and a heat-absorbing surface 540, and may employ a Peltier element as a representative example. The Peltier element acts as a heat pump when current is applied thereto, in which the heat-absorbing surface 540 absorbs heat and dissipates heat from the heat-generating surface 520. Therefore, it is preferred that the heat-absorbing surface 540 of the thermoelectric element 500 be in close contact with the heat-absorbing pack 200 and the heat-generating surface 520 of the thermoelectric element 500 be in close contact with the heat-generating pack 200.

In the meantime, the plurality of heat-generating packs 100 are configured such that the passages 120 in one end thereof are connected to each other and the passages 140 in the opposite ends thereof are connected to each other in the state in which the heat-generating packs 100 and the heat-absorbing packs 200 are stacked on one another. For this, protruding tubes 122 and 142 are respectively formed on the front and rear portions of the passages 120 and 140 of the heat-generating packs 100. The protruding tubes 122 on the passages 120 in one end of each of the heat-generating packs 100 are connected to each other, and the protruding tubes 142 on the passages 140 in the opposite end of each of the heat-generating packs 100 are connected to each other. Therefore, the passages 120 in one end of each of the heat-generating packs 100 which are continuously arranged so as to alternate with the heat-absorbing packs 200 communicate with each other, such that a fluid is concurrently supplied to or discharged from the heat-generating packs 100 through the passages 120. This is the same as in the case of the passages 140 in the opposite end of each of the heat-generating packs 100.

The thickness of a portion when the opposing protruding tubes 122 or 142 are connected to each other is set to be the same as the thickness of the thermoelectric element 500, such that the thermoelectric element 500 can be in close contact between the heat-generating pack 100 and the heat-absorbing pack 200.

In the state in which the plurality of heat-absorbing packs 200 and the heat-generating packs 100 are stacked on each other, the passages 220 in one end of each of the heat-absorbing packs 200 are connected to each other, and the passages 240 in the opposite end of each of the heat-absorbing packs 200 are connected to each other. The protruding tubes 222 and 242 are connected to the front and rear portions of the passages 220 and 240 of the heat-absorbing packs 200, in which the protruding tubes 222 of the passages 220 in one end of each of the heat-absorbing packs 200 are connected to each other, and the protruding tubes 242 of the passages 240 in one end of each of the heat-absorbing packs 200 are connected to each other. Therefore, as in the heat-generating packs 100, the passages 220 in one end of each of the heat-absorbing packs 200 communicate with each other, such that a fluid is concurrently supplied to or discharged from the heat-absorbing packs 200 through the passages 220. This is the same as in the case of the passages 240 in the opposite end of each of the heat-absorbing packs 200.

In addition, the thickness of a portion when the opposing protruding tubes 222 or 242 are connected to each other is set the same as the thickness of the thermoelectric element 500, such that the thermoelectric element 500 can be in close contact between the heat-generating pack 100 and the heat-absorbing pack 200.

Furthermore, heat conduction fin structures 300 are disposed inside the circulation spaces 150 and 250 of the heat-generating packs 100 and the heat-absorbing packs 200. Each heat conduction fin structure 300 extends from one end toward the opposite end in any direction. Both ends of the heat conduction Ems 300 are in close contact with the inner surfaces of the heat-generating packs 100 and the heat-absorbing packs 200.

Due to the above-described configuration, a fluid is concurrently introduced into the individual heat-generating packs 100 through the respective passages 120 in one end of each of the heat-generating packs 100, and the heat-generating packs 100 are respectively in surface contact with the heat-generating surfaces 520 of the thermoelectric elements 500. Consequently, the fluid is heated by the upper and lower surfaces of the heat-generating packs 100 and the heat conduction fins 300 inside the heat-generating packs 100 which are in contact with the upper and lower surfaces. Then, the heated fluid is concurrently discharged through the passages 140 in the opposite end of each of the heat-generating packs 100. Likewise, as for the heat-absorbing packs 200, a fluid is supplied through the passages 220 in one end of each of the heat-absorbing packs 200, is cooled down in the same fashion as above, and is then discharged through the passages 240 in the opposite end of each of the heat-absorbing packs 200.

For this purpose, the thermoelectric elements 500 are respectively interposed between the heat-generating packs 100 and the heat-absorbing packs 200, and are arranged such that the heat-generating surfaces 520 and the heat-absorbing surfaces 540 thereof may exchange their positions. In addition, due to this configuration, when cooling is intended, a cold fluid can be brought into contact with the heat-generating surfaces in the opposite position, thereby enhancing the effect of cooling. When heating is intended, a hot fluid can be brought into contact with the heat-absorbing surfaces in the opposite position, thereby enhancing the effect of heating.

Due to the above-described structure of the heat exchanger having a thermoelectric element according to the exemplary embodiment of the present invention, it is possible to reduce the size of the heat exchanger in order to maximize the efficiency of the thermoelectric elements when the thermoelectric elements are contained in the heat exchanger having a laminated structure. In addition, since the plurality of passages is formed, it is possible to carry out heating/cooling not only in a targeted side but also in the side opposite the thermoelectric elements. It is therefore possible to utilize the maximum efficiency of the thermoelectric elements using, for example, waste heat or dissipation heat of a vehicle.

Although the exemplary embodiments of the present invention have been described for illustrative purposes, those skilled in the art will appreciate that various modifications, additions and substitutions are possible, without departing from the scope and spirit of the present invention as disclosed in the accompanying claims.

What is claimed is:

1. A heat exchanger comprising:
a heat-generating pack defining therein a circulation space, the heat-generating pack having a passage in an upper portion of one end and a passage in a lower portion of an opposite end of the heat-generating pack;
a heat-absorbing pack defining therein a circulation space, the heat-absorbing pack having a passage in a lower portion of one end and a passage in an upper portion of and opposite end of the heat-absorbing pack, wherein the heat-generating pack and the heat-absorbing pack are stacked on each other;
a thermoelectric element disposed between the heat-generating pack and the heat-absorbing pack, the thermoelectric element having a heat-generating surface adjoining the heat-generating pack and a heat-absorbing surface adjoining the heat-absorbing pack; and
a plurality of the heat-generating packs and a plurality of the heat-absorbing packs which alternate with each other and are stacked on one another and plurality of the thermoelectric elements which are respectively interposed between the heat-generating packs and the heat-absorbing packs,
wherein the heat-generating packs and the heat-absorbing packs are stacked on one another such that the passages in one end of each of the heat-generating packs are connected to each other and the passages in the opposite end of each of the heat-generating packs are connected to each other.

2. The heat exchanger of claim 1, wherein each of the heat-generating pack and the heat-absorbing pack includes plate-shaped upper and lower surfaces, peripheries of the upper and lower surfaces adjoining and being coupled with each other.

3. The heat exchanger of claim 1, wherein the heat-generating pack and the heat-absorbing pack are stacked on top of each other such that the passages in one end and the opposite end of the heat-generating packs and the passages in one end and the opposite end of the heat-absorbing packs do not overlap each other.

4. The heat exchanger of claim 1, wherein the heat-generating packs respectively have protruding tubes on front and rear portions of the passages, the protrusions on the passages in one end of each of the heat-generating packs being connected to each other, and the protrusions on the passages in the opposite end of each of the heat-generating packs being connected to each other.

5. The heat exchanger of claim 4, wherein a thickness of each portion where opposing protruding tubes from among the protruding tubes are connected is equal to a thickness of each of the thermoelectric elements, such that the thermoelectric elements are in close contact between the heat-generating packs and the heat-absorbing packs.

6. The heat exchanger of claim 1, wherein the heat-generating packs and the heat-absorbing packs are stacked on one another such that the passages in one end of each of the heat-absorbing packs are connected to each other and the passages in the opposite end of each of the heat-absorbing packs are connected to each other.

7. The heat exchanger of claim 6, wherein the heat-absorbing packs respectively have protruding tubes on front and rear portions of the passages, the protrusions on the passages in one end of each of the heat-absorbing packs are connected to each other, and the protrusions on the passages in the opposite end of each of the heat-absorbing packs are connected to each other.

8. The heat exchanger of claim 7, wherein a thickness of each portion where opposing protruding tubes from among the protruding tubes are connected is equal to a thickness of each of the thermoelectric elements, such that the thermoelectric elements are in close contact between the heat-generating packs and the heat-absorbing packs.

9. The heat exchanger of claim 1, further comprising a heat conduction fin structure inside the circulation space of the heat-generating pack or the heat-absorbing pack, the heat conduction fin structure extending from one end toward the opposite end of the heat exchanger.

10. The heat exchanger of claim 9, wherein both ends of the heat conduction fin structure are in close contact with inner surfaces of the heat-generating pack or the heat-absorbing pack.

* * * * *